(12) United States Patent
Pruemm et al.

(10) Patent No.: US 9,266,721 B2
(45) Date of Patent: Feb. 23, 2016

(54) EUTECTIC BONDING OF THIN CHIPS ON A CARRIER SUBSTRATE

(75) Inventors: Andreas Pruemm, Stuttgart (DE); Karl-Heinz Kraft, Herrenberg (DE); Thomas Mayer, Reutlingen (DE); Arnim Hoechst, Reutlingen (DE); Christoph Schelling, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 266 days.

(21) Appl. No.: 13/989,411

(22) PCT Filed: Nov. 23, 2010

(86) PCT No.: PCT/EP2010/068037
§ 371 (c)(1),
(2), (4) Date: May 23, 2013

(87) PCT Pub. No.: WO2012/069078
PCT Pub. Date: May 31, 2012

(65) Prior Publication Data
US 2013/0241012 A1 Sep. 19, 2013

(51) Int. Cl.
*H01L 21/768* (2006.01)
*B81C 1/00* (2006.01)
(Continued)

(52) U.S. Cl.
CPC ............. *B81C 1/00301* (2013.01); *B81B 7/007* (2013.01); *B81C 3/008* (2013.01);
(Continued)

(58) Field of Classification Search
CPC ............................ H01L 29/66; H01L 23/481
See application file for complete search history.

(56) References Cited

U.S. PATENT DOCUMENTS

| | | | |
|---|---|---|---|
| 6,225,218 B1 * | 5/2001 | Yamazaki et al. | 438/660 |
| 2004/0038500 A1 | 2/2004 | Larson et al. | |

(Continued)

FOREIGN PATENT DOCUMENTS

| | | |
|---|---|---|
| DE | 102005035057 | 2/2007 |
| JP | 2010098281 | 4/2010 |

(Continued)

OTHER PUBLICATIONS

PCT/EP2010/068037 International Search Report and Written Opinion dated Jul. 29, 2011 (English Translation, 12 pages).

(Continued)

*Primary Examiner* — Thomas L Dickey
(74) *Attorney, Agent, or Firm* — Michael Best & Friedrich LLP

(57) ABSTRACT

A method for producing a semiconductor component (166) is proposed. The method comprises the following steps:

a) a semiconductor chip (110) is produced on a starting substrate (112), wherein the semiconductor chip (110) is connected to the starting substrate (112) in at least one supporting location (116), wherein the semiconductor chip (110) has a front side (130) facing away from the starting substrate (112) and a rear side (132) facing the starting substrate (112), b) in at least one through-plating step, at least one through-contact filling material (142) is applied to the semiconductor chip (110), wherein at least one partial region (140) of the rear side (132) is coated with the through-contact filling material (142), c) the semiconductor chip (110) is separated from the starting substrate (112), and d) the semiconductor chip (110) is applied to at least one carrier substrate (150), wherein that partial region (140) of the rear side (132) of the semiconductor chip (110) which is coated with the through-contact filling material (142) is connected to at least one bonding pad (152) on the carrier substrate (150).

15 Claims, 6 Drawing Sheets

(51) Int. Cl.
  B81C 3/00       (2006.01)
  B81B 7/00       (2006.01)
  H01L 21/683     (2006.01)
  G01L 19/00      (2006.01)
  G01L 9/00       (2006.01)
  G01P 15/08      (2006.01)
  G01P 15/12      (2006.01)
  G01P 15/125     (2006.01)
  H01L 23/00      (2006.01)
  H01L 25/065     (2006.01)

(52) U.S. Cl.
  CPC .......... *G01L 9/0048* (2013.01); *G01L 19/0076* (2013.01); *G01P 15/0802* (2013.01); *G01P 15/123* (2013.01); *G01P 15/125* (2013.01); *H01L 21/6835* (2013.01); *H01L 21/76898* (2013.01); *H01L 24/94* (2013.01); *H01L 24/97* (2013.01); *B81C 2203/035* (2013.01); *B81C 2203/051* (2013.01); *G01P 2015/084* (2013.01); *H01L 24/03* (2013.01); *H01L 24/05* (2013.01); *H01L 24/13* (2013.01); *H01L 24/16* (2013.01); *H01L 24/81* (2013.01); *H01L 25/0657* (2013.01); *H01L 2224/02371* (2013.01); *H01L 2224/02372* (2013.01); *H01L 2224/03002* (2013.01); *H01L 2224/0401* (2013.01); *H01L 2224/056* (2013.01); *H01L 2224/05008* (2013.01); *H01L 2224/05009* (2013.01); *H01L 2224/05548* (2013.01); *H01L 2224/13025* (2013.01); *H01L 2224/13124* (2013.01); *H01L 2224/16145* (2013.01); *H01L 2224/16225* (2013.01); *H01L 2224/16245* (2013.01); *H01L 2224/81805* (2013.01); *H01L 2224/94* (2013.01); *H01L 2224/97* (2013.01); *H01L 2225/06513* (2013.01); *H01L 2225/06541* (2013.01); *H01L 2924/01322* (2013.01); *H01L 2924/10253* (2013.01); *H01L 2924/14* (2013.01); *H01L 2924/1433* (2013.01); *H01L 2924/1461* (2013.01); *H01L 2924/157* (2013.01); *H01L 2924/1579* (2013.01); *H01L 2924/15787* (2013.01); *H01L 2924/15788* (2013.01)

(56) References Cited

U.S. PATENT DOCUMENTS

| | | |
|---|---|---|
| 2006/0051949 A1 | 3/2006 | Nemoto |
| 2008/0017956 A1 | 1/2008 | Lu et al. |
| 2008/0272465 A1 | 11/2008 | Do et al. |
| 2008/0308303 A1 * | 12/2008 | Lehmann et al. ............ 174/255 |
| 2010/0283147 A1 | 11/2010 | Kramer et al. |
| 2011/0169107 A1 | 7/2011 | Kramer et al. |

FOREIGN PATENT DOCUMENTS

| | | |
|---|---|---|
| WO | 2007089206 | 8/2007 |
| WO | 2009/138138 | 11/2009 |

OTHER PUBLICATIONS

Zimmerman et al., "Ultra-Thin Chip Fabrication and Assembly Process," Oct. 1, 2008, pp. 531-534.

* cited by examiner

EUTECTIC BONDING OF THIN CHIPS ON A CARRIER SUBSTRATE

BACKGROUND OF THE INVENTION

So-called chip film processes for producing thin chips are known from the prior art. Said chip film processes are described, for example, in M. Zimmermann et al., "A Seamless Ultra-Thin Chip Fabrication and Assembly Technology", Tech. Dig. IEDM, pp. 1010-1012, 2006. In the case of the chip film technology, depressions, which are also designated as "cavities", are produced on a starting substrate, in particular a carrier wafer composed of conventional silicon, by means of specific etching methods. Said depressions or cavities are produced by producing porous silicon and subsequently removing porous silicon (APSM process). Silicon suitable for circuits is then applied on said cavities by means of an epitaxy method. This applied layer later forms the ultra-thin microchip. The desired circuit structure is then processed on this surface by conventional methods. Afterward, by means of a process also designated as "pick, crack and place" technology, the chip can be sucked up (pick) by a vacuum pipette, detached (crack) from the starting substrate and then positioned (place) on an arbitrary further carrier substrate.

The prior art likewise discloses methods for producing electrical contacts on or through a wafer or chip. By way of example, in this case it is possible to produce narrow holes having virtually perpendicular walls in a wafer, to insulate them and then to fill them wholly or partly with a conductive material, for example metal or silicon. Furthermore, eutectic bonding methods at the wafer level and for so-called "chip-to-wafer processes" are known from microsystems technology. In the area of the applications, approaches for integrating sensor chips and evaluation ICs in a chip composite assembly are known.

SUMMARY OF THE INVENTION

Proceeding from the known prior art, the present invention provides a method for producing semiconductor components which is able to improve a connection between semiconductor chips, in particular thin semiconductor chips, with carrier substrates. The proposed method is suitable, in particular, for producing sensor elements on the basis of semiconductor components, as will become apparent in even greater detail from the description below.

The proposed method for producing a semiconductor element comprises the steps described below, which are preferably carried out in the order presented. Alongside the method steps mentioned, even further method steps can be provided, and individual or a plurality of method steps can be carried out temporally in parallel and/or repeatedly.

In a first method step, a semiconductor chip is produced on a starting substrate. In this case, the semiconductor chip is connected to the starting substrate in at least one supporting location and has a front side facing away from the starting substrate and a rear side facing the starting substrate. The semiconductor chip can be designed, in particular, as a thin chip, that is to say as a chip having a thickness of less than 100 µm, preferably of less than 50 µm and particularly preferably of less than 20 µm. The semiconductor chip can be produced, in particular, on the basis of silicon. In particular, the chip film method described above can be used for the production of the semiconductor chip, such that, by way of example, as starting substrate it is possible to use silicon which has one or a plurality of cavities, which are wholly or partly filled with porous semiconductor material, in particular porous silicon.

The semiconductor chip can then be constructed on the porous semiconductor material epitaxially, for example, and the porous material is removed preferably in the APSM process. As has likewise been explained above, the semiconductor chip can be patterned and acquire at least one functionality by means of conventional semiconductor methods.

In a second method step, which is also designated hereinafter as a through-plating step, at least one through-contact filling material is applied to the semiconductor chip. In this case, at least one partial region of the rear side is coated with the through-contact filling material. At the same time, as will be explained in even greater detail below, during the through-plating step, at least one wall of at least one plated-through hole, that is to say of an opening in the semiconductor chip, for example of a narrow opening perpendicular to the surface of the semiconductor chip, and at least one sidewall of the semiconductor chip can be coated with the through-contact filling material. In this case, a through-contact filling material should be understood to mean a material which has at least semiconducting properties, that is to say a semiconductor material or a conductor material. Said through-contact filling material can therefore serve as a carrier of the electric current. In particular, as will be explained in even greater detail below, the through-contact filling material can be a material that can be deposited from a liquid phase and/or a gas phase.

In a third method step, the semiconductor chip is separated from the starting substrate. During this separation, the supporting locations are severed, for example by a mechanical and/or a chemical method. By way of example, during this separation, it is possible to use the "pick, crack and place" method described above, such that, by way of example, the semiconductor chip can be sucked up by a vacuum pipette, rotated or tilted and thereby detached from the starting substrate and, finally, provided for further use. However, other techniques are also possible, in principle.

In a fourth method step, the semiconductor chip is applied to at least one carrier substrate, wherein that partial region of the rear side of the semiconductor chip which is coated with the through-contact filling material is connected to at least one bonding pad on the carrier substrate. In this case, a bonding pad should be understood to mean a conductive structure on the surface of the carrier substrate which can form a conductive connection together with the at least one partial region. The at least one bonding pad can have, for example, a rectangular form, a frame form, a circular form, or any other desired form, which can follow wholly or partly that partial region of the rear side of the semiconductor chip which is coated with the through-contact filling material, or which can also have a different structure, in principle.

This basic form of the production method proposed can advantageously be developed further in various ways. Thus, as explained above, additional method steps can be provided. It is particularly preferred, moreover, if a eutectic bonding method is used in the fourth method step for connecting that partial region of the rear side of the semiconductor chip which is coated with the through-contact filling material to the at least one bonding pad. In this case, a eutectic bonding method is understood to mean a specific connection method which is based on forming a connection by means of a eutectic alloy. In this case, a eutectic alloy should be understood to mean a mixture of conductor or semiconductor materials, for example silicon and gold or germanium and aluminum, in which the constituents of the mixture are in a ratio to one another such that the melting point of the alloy is below the melting points of the individual elements.

The through-contact filling material can comprise, in particular, at least one semiconductor material. In this case, germanium or else silicon is particularly suitable. Accordingly, the bonding pad can comprise a material which can preferably form a eutectic alloy with the through-contact filling material. By way of example, the bonding pad can comprise aluminum, which can form a eutectic alloy with germanium, in particular, as through-contact filling material. Alternatively or additionally, the bonding pad can also comprise gold, for example, while the through-contact filling material comprises silicon. A further possible material combinations would be gold-germanium. Generally, it is preferred if the bonding pad comprises a metallic material, while the through-contact filling material comprises a semiconductor material, wherein the metallic material and the semiconductor material can form a eutectic alloy.

In the through-plating step, as already explained above, further regions of the semiconductor chip can be coated in addition to the coating of at least one partial region of the rear side of the semiconductor chip. By way of example, it is possible to provide plated-through holes, that is to say openings in the semiconductor chip, which, for example, connect the front side to the rear side or connect at least one layer plane of the semiconductor chip to at least one other layer plane. Said openings can have a round or polygonal cross section, for example, wherein at least one wall of said plated-through hole can be coated in the through-plating step. Alternatively or additionally, in the through-plating step, at least one sidewall of the semiconductor chip can be coated with the through-contact filling material. In this case, a sidewall should be understood to mean a surface of the semiconductor chip that is different from the front side and the rear side, preferably a surface which is substantially perpendicular to the front side and to the rear side, wherein the front side and the rear side are preferably oriented parallel to one another. By way of example, said sidewall can be produced, in the chip film method described above, in a so-called trenching step, in which the surface and the outer edges of the semiconductor chip are defined. In this trenching method it is possible to use mechanical or else chemical separating methods, for example DRIE (Deep Reactive Ion Etching).

In a further preferred configuration of the method, in the through-plating step, at least one frame is produced on the rear side. This can be, in particular, a closed frame. Said frame can be applied for example to the side edges of the rear side of the semiconductor chip and follow said side edges, for example. The frame can preferably have a width which is less than 100 μm, preferably less than 50 μm, in particular 10 μm or less or even just 1 μm. After the semiconductor chip has been applied to the carrier substrate, an interspace, in particular a hermetically sealed interspace, arises within the frame. Said interspace is delimited by the rear side of the semiconductor chip, a front side of the carrier substrate, said front side facing the semiconductor chip, and the frame. Further structures can additionally be provided for delimitation. The sealed interspace can be used, for example, as will be explained in even greater detail below, as a reference vacuum of a pressure sensor. In this case, a hermetically sealed interspace should be understood to mean an interspace in which an exchange of gas from the interspace with an environment of the semiconductor component takes place in a greatly retarded fashion, preferably on a time scale of several months or even several years, in particular in a greatly retarded fashion in comparison with customary operational times of the semiconductor component.

In the through-plating step, it is possible to use, in particular, an isotropic deposition method, preferably a conformal deposition method, that is to say a deposition method in which the deposited through-contact filling material at least partly follows the outer contours of the semiconductor chip or of further components. In particular, in this case liquid phase deposition methods and/or vapor deposition methods are appropriate, for example CVD methods (Chemical Vapor Deposition), for example LPCVD methods (low pressure CVD).

As already explained above, the semiconductor chip can be designed, in particular, in such a way that it comprises one or a plurality of functional elements of the semiconductor component. In particular, the semiconductor chip can comprise at least one of the following elements: an integrated circuit; a sensor structure; a micromechanical structure. These functional elements can be arranged wholly or partly on the semiconductor chip and can be produced by means of conventional methods such as are known to the person skilled in the art from semiconductor technology.

Further possible developments of the invention relate to carrying out the through-plating step. Thus, by way of example, before the through-plating step, in particular, at least one insulating material can be applied to the semiconductor chip. Said insulating material can be, for example, an organic material or else an inorganic material. The use of dielectric layers, for example silicon oxide layers, is particularly preferred. As an alternative or in addition to the use of such an insulating material, which is intended to prevent at least partly an electrical contact between the through-contact filling material and specific functional elements of the semiconductor chip, it is also possible to employ other processes. By way of example, it is possible to use CMOS processes in which the semiconductor chip is used with an insulation doping at least in regions, for example in order to avoid short-circuits. Once again alternatively or additionally, after the through-plating step, the through-contact filling material can be at least partly removed again from the semiconductor chip. For this removal it is possible to use, for example, conventional semiconductor methods of wet-chemical or dry-chemical nature, for example wet-chemical or dry etching methods. In this regard, reference can be made to known etching methods. So-called lift-off processes are also conceivable, in principle, that is to say processes in which regions of the semiconductor chip which are not intended to be coated with the through-contact filling material are coated beforehand with a layer which is removed again from the semiconductor chip after the through-plating step.

Further possible developments of the invention relate to the configuration of the semiconductor chip. As explained above, the semiconductor chip can be produced, in particular, according to a chip film method. Accordingly, it is particularly preferred if the semiconductor chip comprises a monocrystalline semiconductor membrane, in particular a monocrystalline silicon membrane. Other semiconductor materials are also possible, however, in principle. The supporting location can also comprise a porous material, preferably porous silicon, besides monocrystalline material, preferably silicon.

Besides the proposed method in one or more of the configurations described above, a semiconductor component is furthermore proposed which is producible according to a method in accordance with one or more of the embodiment variants described. In particular, the semiconductor component can be selected from the following semiconductor components: a pressure sensor; an inertial sensor; an acceleration sensor; a switch. Generally, therefore, the semiconductor component can be wholly or partly configured in particular as a sensor element and/or comprise a sensor element of this type.

By means of the invention proposed, therefore, it is possible to produce semiconductor components which can comprise, in particular, thin chips and which can have through-contacts. In this case, besides the electrical feedthrough, the through-contacts can simultaneously perform the task of enabling a hermetically tight and space-saving mechanical connection between the semiconductor chips, in particular thin chips, and in principle any desired carrier substrates, for example circuit boards, leadframes or else carrier substrates of complex mechanical and/or electrical configuration, for example carrier chips such as ASICs (Application Specific Integrated Circuit). In this case, the through-contact filling material can simultaneously serve as a material component for eutectic bonding of the semiconductor chip onto the carrier substrate. Thin chips having ICs and/or sensor structures with through-contacts can be produced on a monocrystalline silicon membrane with supporting locations, for example by means of the chip film method described above. Afterward, the through-contact filling material, for example germanium, can be deposited in the same deposition process also on the membrane underside, that is to say the rear side of the semiconductor chip, in a region adjoining the through-contact. The thin chips can be positioned on metal bonding pads, for example aluminum, of a carrier substrate, and it is possible to produce a eutectic bond between the through-contact filling material and the bonding pad.

By means of the method proposed it is possible, in particular, to realize different types of micromechanical sensors, in particular on a carrier IC chip as carrier substrate. In this case, the semiconductor chip, though a plurality of semiconductor chips can also be provided, can be used in particular as thin chip, as membrane for pressure sensors, as finger structure for inertial sensors, as switch, as second counterelectrode for z-acceleration sensors or in some other way as part of a sensor element.

In the case of the method proposed and the structural conductor semi elements proposed, the fact that the optional eutectic bond can be embodied stably and hermetically tightly even with a small connection width has a particularly advantageous effect. It is possible to realize small bonding frame widths or through-contacts, in particular widths of less than 10 μm. In the case of the method proposed, semiconductor chips, in particular thin chips, can also be bonded in a stress-free manner, such that a low rejects rate and a long lifetime of the semiconductor components can be realized. Furthermore, integration of a sensor element and an IC can be realized in conjunction with the smallest possible space consumption. On a carrier substrate, for example a carrier chip, it is also possible to integrate a plurality of semiconductor chips, for example a plurality of thin chips, and thus preferably a plurality of functions one above another and/or alongside one another.

In the case of the method proposed, conventional method techniques can be used and modified according to the invention. Overall, the method can be realized very simply and, in principle, with conventional process techniques. Thus, by way of example, the at least one through contact can be produced at the same time as a singulation trench that is already produced nowadays in the chip film methods described above. Furthermore, on the semiconductor chip and/or the carrier substrate it is possible to produce functional elements by means of standard techniques such as already used nowadays, such that the proposed method overall can be realized very cost-effectively.

BRIEF DESCRIPTION OF THE DRAWINGS

Exemplary embodiments of the invention are illustrated in the figures and explained in greater detail in the description below.

In the figures.

DETAILED DESCRIPTION

FIGS. 1A to 1H schematically show method steps of an exemplary embodiment of a production method according to the invention for producing a semiconductor component.

Figure 1A:
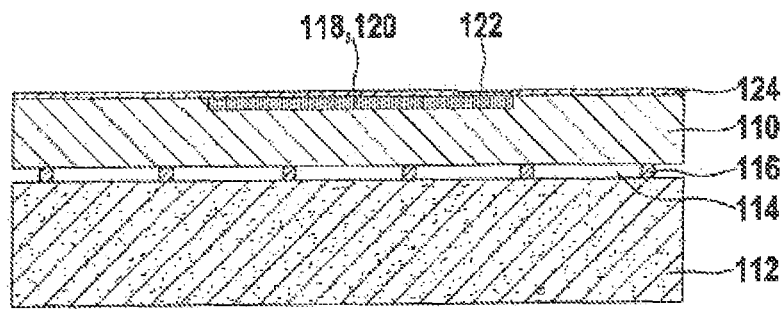
FIGS. 1A to 1H show method steps of an exemplary embodiment of a method for producing a semiconductor component.

FIG. 1A shows by way of example a first method step, in which a semiconductor chip 110 is produced on a starting substrate 112. This production takes place here by way of example in a chip film process. In this case, the semiconductor chip 110 is designed as an epitaxial membrane, for example as a silicon membrane, which is formed above a cavity 114 between the starting substrate 112 and the semiconductor chip 110. In this case, the semiconductor chip 110, for example a silicon membrane, is held by supporting locations 116, which can be designed, for example, in the form of crystalline and/or porous silicon. Within the semiconductor chip 110, by means of conventional methods, one or a plurality of functional elements 118, for example functional layers 120, can be integrated and/or deposited on the surface of the semiconductor chip 110. In this way, the semiconductor chip 110 can comprise a layer stack, for example.

Furthermore, the semiconductor chip 110, for example a layer stack of the semiconductor chip 110, preferably comprises at least one electrical contact 122, for example a bonding pad, which is preferably surrounded by an insulating layer 124, for example an oxide.

Figure 1B:
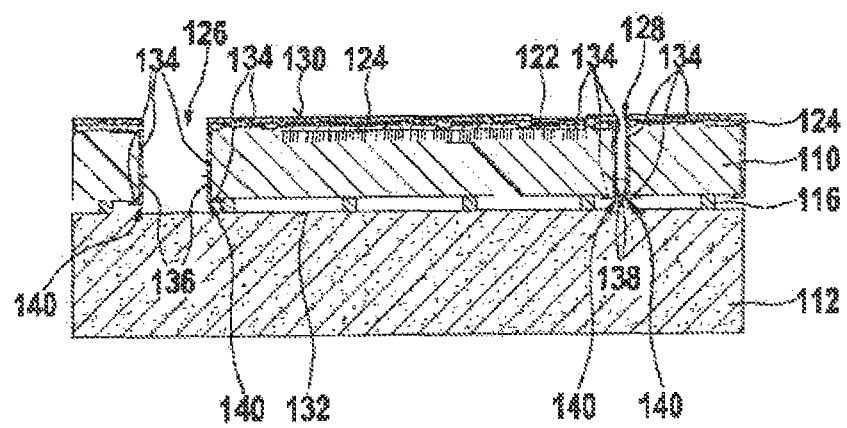

By means of a so-called trench method, trenches 126, for example sawing trenches, are subsequently produced in the exemplary embodiment illustrated, as shown in FIG. 1B. Furthermore, optionally one or a plurality of through-contacts 128 are produced, which are designed as simple openings in the semiconductor chip 110 in this exemplary embodiment. Said through-contacts 128 can connect, for example, a front side 130 of the semiconductor chip 110, said front side facing away from the starting substrate 112, to a rear side 132 of the semiconductor chip 110, said rear side facing the starting substrate 112.

By means of a preferably conformal deposition method, a dielectric layer 134 is finally applied to the semiconductor chip 110. By way of example, said dielectric layer can in turn comprise an oxide layer, preferably silicon oxide. Examples of appropriate deposition methods include known deposition methods, in particular TEOS ozone methods, SACVD layers, low temperature oxide methods or similar methods. In these methods, sidewalls 136 of the semiconductor chip 110 in the region of the trenches 126 and/or sidewalls 138 of the through-contacts 128 are also coated with the dielectric layer 134. Furthermore, in this exemplary embodiment, partial regions 140 on the rear side 132 in the region of the trenches 126 and/or the through-contacts 128 are also coated with the dielectric layer 134.

Figure 1C:
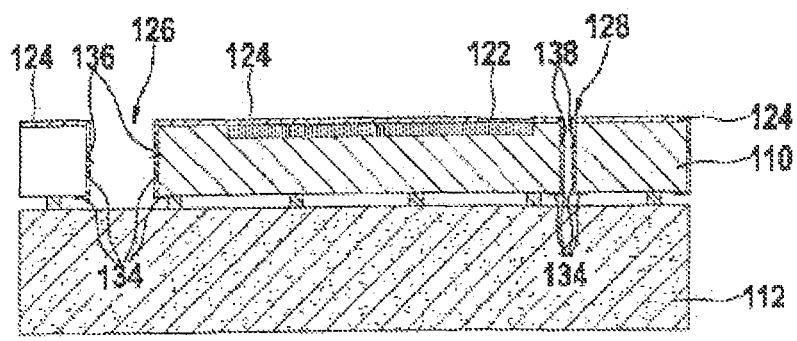

Afterward, by means of a highly anisotropic, directional oxide etching, the dielectric layer 134 is thinned at the front side 130, that is to say the chip surface of the semiconductor chip 110, and the electrical contact 122, for example the bonding pad, is opened, without significantly thinning the sidewall protection in the region of the sidewalls 136, 138. A result of this method step is shown in FIG. 1C. Alternatively, the oxide etching and opening of the electrical contacts 122 can also be carried out using other techniques, for example using a spray coating technique. Various other techniques are known to the person skilled in the art from the field of semiconductor fabrication.

In a method step illustrated in FIG. 1D, a through-contact filling material 142 is subsequently applied, preferably in a conformal deposition method. By way of example, said through-contact filling material 142 can comprise germanium. By way of example, it is possible to use an LPCVD method, that is to say a low pressure CVD method. On account of the conformal deposition, the layer of the through-contact filling material 142 follows the contour of the semiconductor chip 110, such that, besides the front side 130, furthermore the sidewalls 136 of the semiconductor chip 110 and optionally the sidewalls 138 of the through-contacts 128 are also coated, and also in turn partial regions 140 on the rear side 132 of the semiconductor chip 110.

Figure 1D:
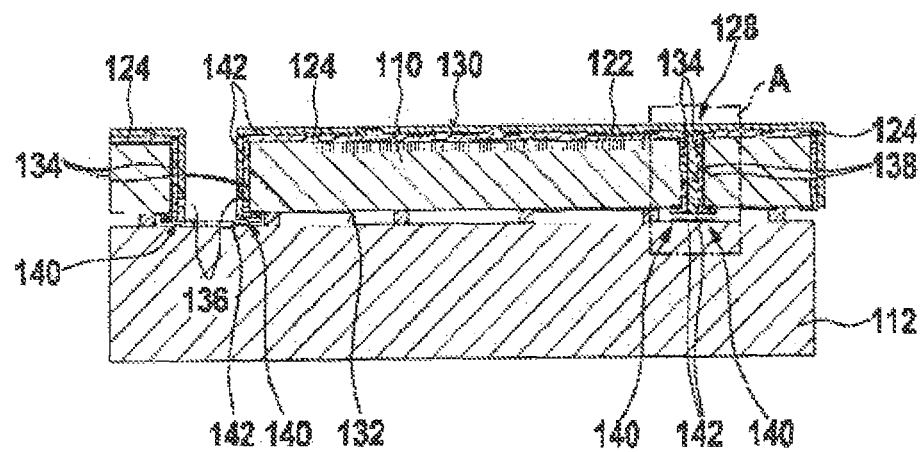
Figure 1E:
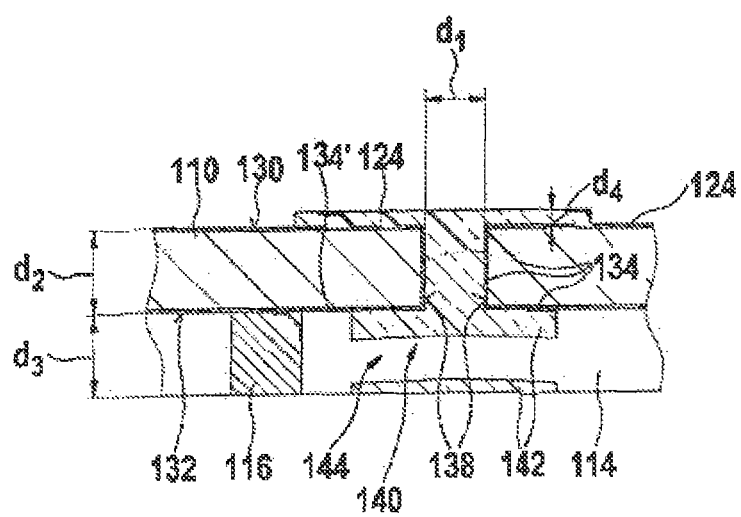

FIG. 1E shows that partial region of the semiconductor chip 110 which is designated by the letter A and framed by a broken line in FIG. 1D and comprises a through-contact 128. The advantages of a conformal deposition of the through-contact filling material 142 become visible in this illustration. The partial regions 140 within which the rear side 132 of the semiconductor chip 110 is also coated with through-contact filling material 142 are preferably not larger than the partial regions in which the rear side 132 is coated with the dielectric layer 134 (see, for example, FIG. 1B above).

FIG. 1E illustrates typical dimensions. Thus, the openings of the through-contacts 128 typically have a diameter D1 of less than 2 µm. The membrane of the semiconductor chips 110 typically has a thickness $d_2$ of approximately 10 to 20 µm. These openings can be closed with an approximately 1 µm thick layer of the through-contact filling material 142, for example a germanium layer. In the cavity 114, which preferably has a depth $d_3$ of more than 3 µm, through-contact filling material 142, for example less than 1 µm, is in each case deposited at the rear side 132 of the semiconductor chip 110 and at the bottom of the cavity. Consequently, a gap 144 remains between semiconductor chip 110 and the bottom of the cavity, as a result of which it still remains possible to thicken the semiconductor chips 110. Preferably, the through-contact filling material 142 is therefore applied with a thickness $d_4$ which is less than half of the height $d_3$ of the cavity 114.

Figure 1F:
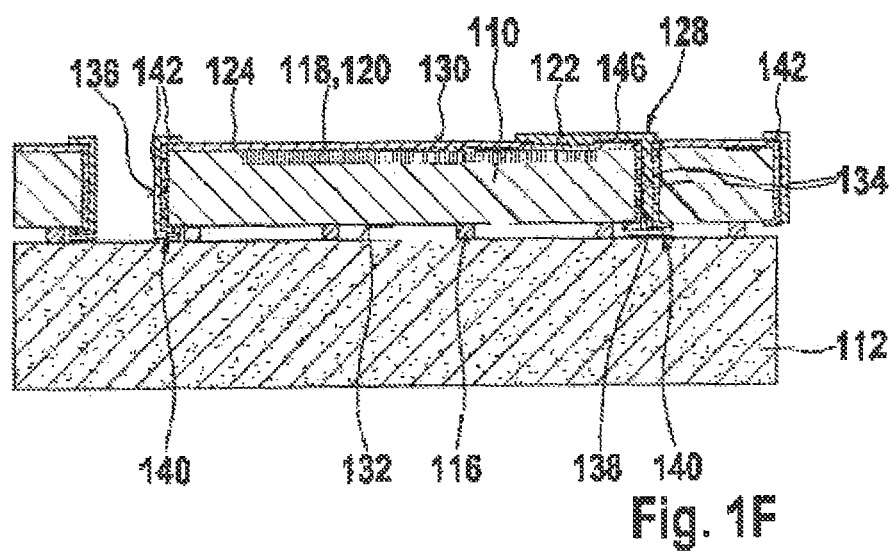

FIG. 1F shows an optional method step in which the through-contact filling material 142 is at least partly removed again, in particular from the front side 132 of the semiconductor chip 110. On the sidewalls 136 and 138, the coating with the through-contact filling material 142 can be retained in this case, and likewise in the partial regions 140. At the same time, the through-contact filling material 142 can be patterned in this case, for example in order to produce on the front side 130 optionally conductor tracks 146 and/or other structures, which can also be wholly or partly a constituent part of the functional elements 118. In the example illustrated in FIG. 1F, therefore, by way of example, the electrical contact 122 can be electrically contact-connected from the rear side 132 via the conductor track 146 shown and the through-contact 128. In principle, techniques known from semiconductor fabrication can be used for patterning the through-contact filling material 142. Thus, by way of example, spray coatings, standard lithography or standard etching methods can be used. Such methods are known in principle to the person skilled in the art.

Figure 1G:
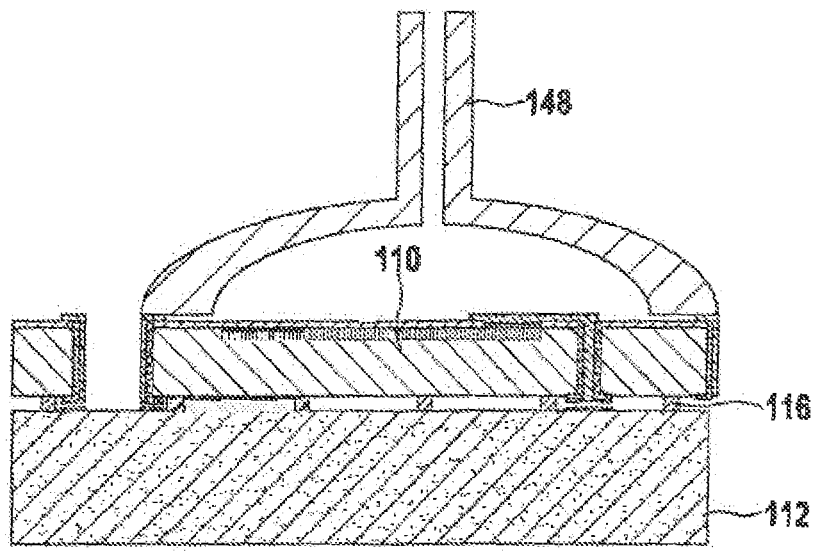

Afterward, as illustrated in FIG. 1G, the semiconductor chip 110 can be separated from the starting substrate 112. In this case, the supporting locations 116 are severed. This separating process, which is also designated as "picking", can be effected by means of a vacuum pipette 148, for example, as illustrated in FIG. 1G. However, other methods are also possible in principle, for example mechanical gripping methods. In order to sever the supporting locations 116, by way of example, torsion can be effected about an axis perpendicular to the surface of the semiconductor chip 110, and/or some other type of tilting can be effected. Other separating techniques are also possible, however, in principle.

Figure 1H:
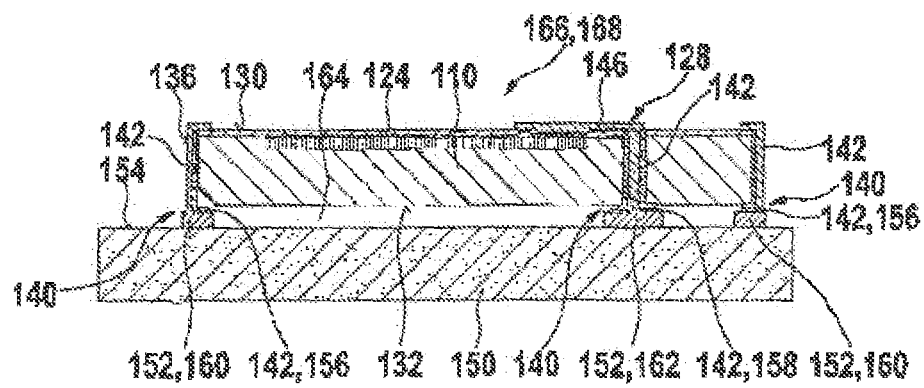

In a further method step, illustrated in FIG. 1H, the semiconductor chip 110 is then applied to a carrier substrate 150. Said carrier substrate 150 can comprise, for example, a circuit board and/or a leadframe and/or some other type of carrier substrate 150. The carrier substrate 150 comprises at least one bonding bath 152 on its surface 154 to be populated. In this case, bonding pads 152 should be understood, in principle, to mean any desired electrical structures, which, for example, can also comprise conductor tracks, frames, connection contacts or the like. In the exemplary embodiment illustrated in FIG. 1H, the partial regions 140 provided with through-contact filling material 142 on the rear side 132 of the semiconductor chip 110 comprise, for example, a frame 156, which preferably completely encloses the edges of the semiconductor chip 110, and also through-contact pads 158, which are connected to the through-contact filling material 142 in the interior of the through-contacts 128 and, via the latter, for example, to conductor tracks 146 on the front side 130 of the semiconductor chip 110. Corresponding to these in the case of the bonding pads 142 there are bonding pad frames 160 or bonding pad contacts 162. These can also be functionally mixed, since, for example, the coating with through-contact filling material 142 on the sidewalls 136 can also perform electrical tasks.

In the placement step illustrated in FIG. 1H, therefore, the through-contact filling material 142 on the rear side 132 of the semiconductor chip 110 is placed onto the bonding pads 152 of the carrier substrate 150. Afterward, semiconductor chip 110 and carrier substrate 150 are preferably eutectically bonded to one another. By way of example, the bonding pads 152 can comprise aluminum, which can form a eutectic alloy with the through-contact filling material 142 of the semiconductor chip 110, for example germanium. For the bonding step, by way of example, a heat treatment step can be carried out in order to form the eutectic alloy at least in a boundary region between the bonding pads 152 and the through-contact filling material 142.

Eutectic bonding connections having a connection width of preferably 1 µm are hermetically tight, at least in theory. In this way, a hermetically sealed interspace 164 can be formed between the semiconductor 110 and the carrier substrate 150, which may be advantageous for many applications. The small bonding width that is possible additionally makes it possible that thin chips with germanium through-contacts can also be placed or bonded on other carrier chips or other wafers in a space-saving manner. Accordingly, the carrier substrate 150 itself can have one or a plurality of functionalities and, in principle, be designed to be considerably more complex than is illustrated in FIG. 1H. By way of example, this makes it possible to generate microelectromechanical components (MEMS). Important examples of semiconductor components 166 which can be produced in this way are micromechanical or microelectrical sensor elements, which are also designated by reference numeral 168 hereinafter. However, other applications are also possible in principle.

Figure 2:
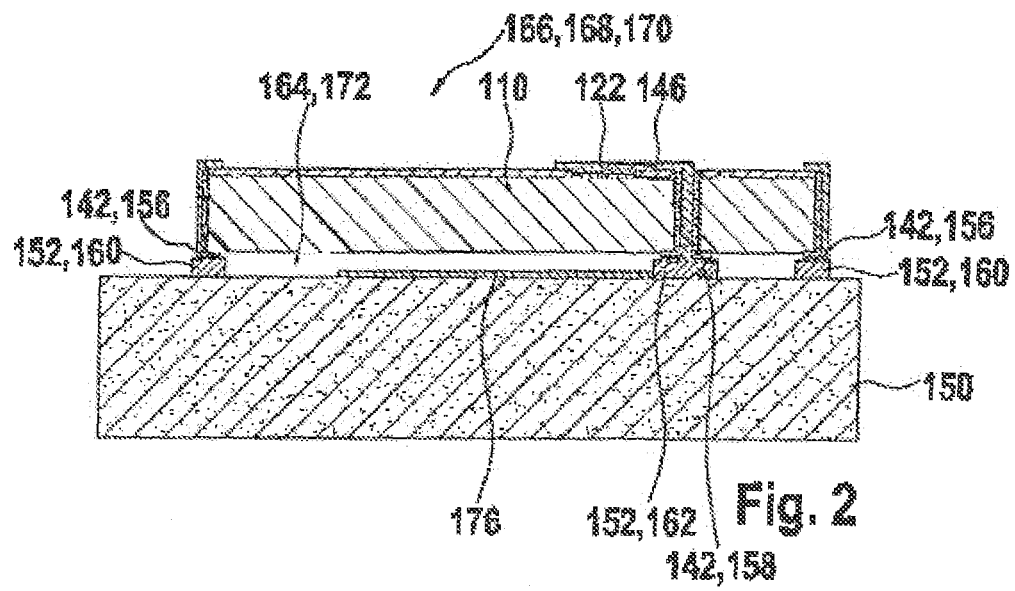
FIG. 2 shows an exemplary embodiment of a pressure sensor producible according to the invention.
Figure 3:
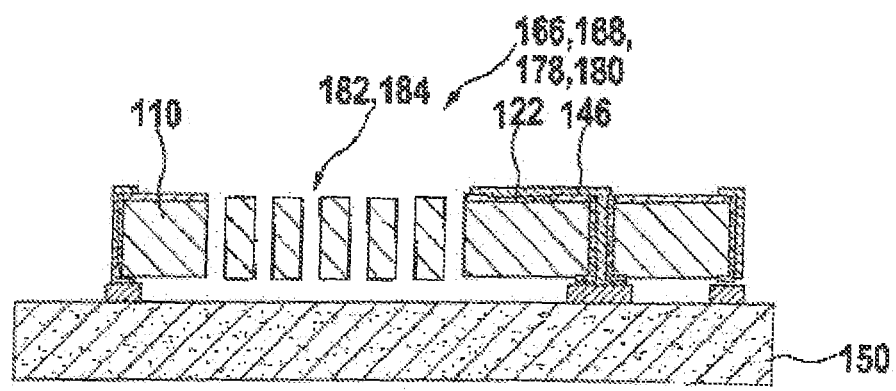
FIG. 3 shows an exemplary embodiment of an inertial sensor producible according to the invention.
Figure 4:
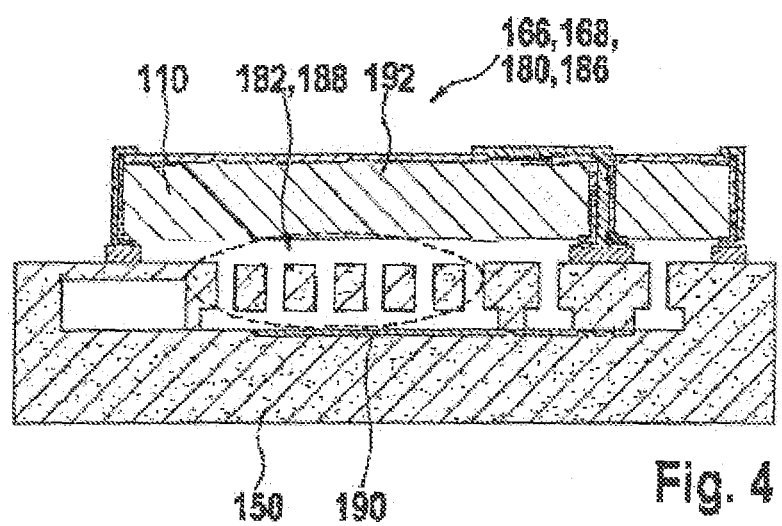
FIG. 4 shows an exemplary embodiment of a z-acceleration sensor producible according to the invention.

FIGS. 2 to 4 show various examples of such semiconductor components 166 with sensor elements 168 and/or semiconductor elements 166 comprising sensor elements 168. These constitute, in principle, modifications of the semiconductor component 166 shown in FIG. 1H, and so, for substantial parts of these exemplary embodiments, reference can be made to the description of said FIG. 1H and of the process in FIGS. 1A to 1H.

FIG. 2 shows an example of a pressure sensor 170. In the case of such pressure sensors 170, the possibility of producing a hermetically sealed interspace 164 becomes apparent particularly advantageously since said interspace 164 can be used as a reference vacuum 172, for example, and/or can be filled with a gas having a predefined or known pressure. Thus, on account of the fact that, in particular, eutectic connections are distinguished by a high hermeticism with a small conductor track density, a reference pressure can be included between the carrier substrate 150, for example a carrier chip, and the semiconductor chip 110, for example a thin chip. For this purpose, the carrier substrate 150 can, for example, be designed as an integrated circuit and/or comprise such an integrated circuit, for example an ASIC. The carrier substrate 150 can, for example, be or comprise a semiconductor carrier substrate and/or a carrier substrate composed of some other material, for example composed of a ceramic material or a glass. Other materials are also possible in principle, for example plastics materials. The semiconductor chip 110 itself can act, in particular, as a pressure-sensitive membrane 174. Said pressure-sensitive membrane 174 can also comprise resistors and/or other electrical components, for example resistors for piezoresistive read-out. Alternatively, or additionally, said pressure-sensitive membrane 174 can also function wholly or partly as a moveable electrode of a capacitor and/or comprise such a moveable electrode, wherein a bottom fixed electrode 176 can be provided on the carrier substrate 150, for example, as shown in FIG. 2. Alternatively, a semiconductor chip 110 in the form of a thin chip IC, which can simultaneously serve as a membrane 174, can be bonded on a carrier substrate 150, for example a prepatterned carrier substrate 150, optionally with a cavity. For functional principles of micromechanical pressure sensors which can also be realized in the context of the present invention, reference may be made, for example, to Robert Bosch GmbH: Sensoren im Kraftfahrzeug [Sensors in Motor Vehicles], Edition 2007, pages 128 to 130.

FIG. 3 shows a further example of a semiconductor component 166 in the form of a sensor element 168, which in this example is designed as an inertial sensor 178. Inertial sensors are sensor elements 168 which serve for measuring acceleration forces and rotational forces, for example for measuring linear acceleration forces. An inertial sensor 178 generally comprises at least two, preferably three or more, acceleration sensors 180 for different spatial directions or coordinates. In the example illustrated, the semiconductor chip 110 once again substantially corresponds to the exemplary embodiment in accordance with FIG. 1H, such that reference can once again be made to the above description. In this case, however, a micromechanical structure 182 in the form of a finger structure 184 was produced within the semiconductor chip 110. Said finger structure 184 can be produced, for example, at the same time as the production of the trenches 126 as illustrated in FIG. 1B, that is to say the trenching. Said finger structures 184, wherein it is also possible to provide a plurality of such finger structures 184, for example for different spatial directions, therefore in turn form an MEMS, which, for example, can be read and/or driven capacitively. For the construction and the mode of operation of such inertial sensors 178, reference may be made, for example, to Robert Bosch GmbH: Sensoren im Kraftfahrzeug [Sensors in Motor Vehicles], Edition 2007, pages 144 to 146. However, other constructions and modes of operation are also once again possible in principle. The semiconductor chip 110 can, for example, be bonded onto a carrier substrate 150 with an ASIC and/or in the form of an ASIC by means of the eutectic bonding technique. Afterward, capping can optionally be effected.

FIG. 4 illustrates a so-called z-acceleration sensor 186 as a further example of a semiconductor component 166 and sensor element 168. In this case, the carrier substrate 150 comprises a micromechanical structure 182, which functions as a moveable electrode 188 and is framed by a dashed line in the illustration in FIG. 4. Furthermore, the carrier substrate 150 comprises a bottom fixed electrode 190. The bonded semiconductor chip 110, for example the thin chip, can wholly or partly function as a top fixed electrode 192 and/or comprise such a top fixed electrode 192. Alternatively or additionally, the semiconductor chip 110 can also be utilized simply as a cap for the moveable electrode 188. During the operation of the z-acceleration sensor 168, a z-movement of the moveable electrode 188, which therefore functions as a z-electrode, in a z-direction, that is to say a connection direction between the carrier substrate 150 and the semiconductor chip 110, can be evaluated, for example differentially. For the mode of operation and driving, reference may once again be made, by way of example, to Robert Bosch GmbH: Sensoren im Kraftfahrzeug [Sensors in Motor Vehicles], Edition 2007, pages 144 to 146. However, other measurement principles and/or driving systems are also possible in principle.

Figure 5:
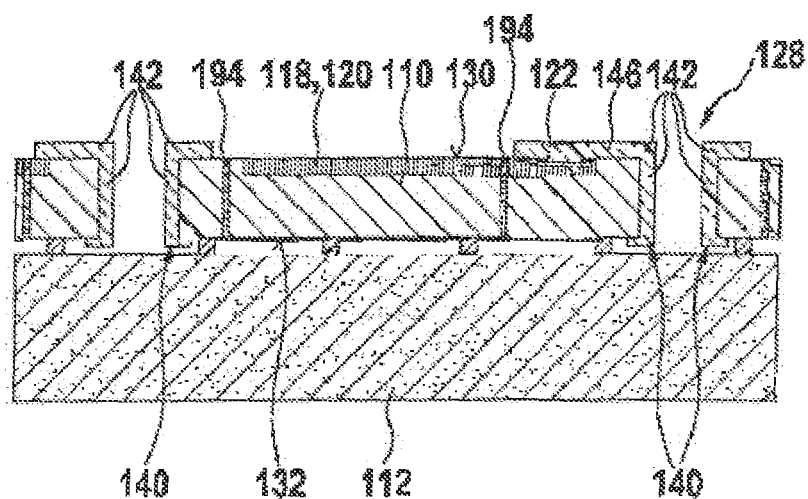
FIG. 5 shows a method variant with a CMOS process.

The process steps illustrated in FIGS. 1A to 1H are only possible exemplary embodiments for realizing the method according to the invention. Numerous modifications in the design and in the procedure are possible in the context of the present invention. Thus, as illustrated in FIG. 5, by way of example, the application of the insulating layer 124 can also be wholly or partly dispensed with. The illustration shows a construction substantially corresponding to the illustration in FIG. 1F, and so reference may substantially be made to the description of said illustration. In contrast to FIG. 1F, however, a CMOS process is used. Such processes are known in principle to the person skilled in the art from semiconductor technology. In this case, by means of deep doping profiles, it is possible to introduce isolation trenches or other types of isolation dopings 194 into the semiconductor chip 110 or regions of the semiconductor chip 110. In this way, by way of example, without an insulating layer 124 and/or without dielectric layers 134, through-contact filling materials 142 can be applied to the semiconductor chip 110 and/or introduced into the semiconductor chip 110, without thereby risking shortcircuits with other components, for example functional elements 118 of the semiconductor chip 110. In this way, it is possible to avoid a short circuit in the bonding and circuit region. In this case, therefore, the deposition of a dielectric layer 134 and/or of an insulating layer 124 is not absolutely necessary.

The semiconductor components 166 according to the invention, in particular with the through-contacts according to the invention, are of great importance for the further implementation of thin chips, in particular of chips produced by the chip film method. A simple and cost-effective technique is made possible with the through-contact design proposed.

What is claimed is:

1. A method for producing a semiconductor component (166), comprising the following steps:
   a) producing a semiconductor chip (110) on a starting substrate (112), wherein the semiconductor chip (110) is connected to the starting substrate (112) in at least one supporting location (116), wherein the semiconductor chip (110) has a front side (130) facing away from the starting substrate (112) and a rear side (132) facing the starting substrate (112),
   b) in at least one through-plating step, applying at least one through-contact filling material (142) to the semiconductor chip (110), wherein at least one partial region (140) of the rear side (132) is coated with the through-contact filling material (142),
   c) separating the semiconductor chip (110) from the starting substrate (112), and
   d) applying the semiconductor chip (110) to at least one carrier substrate (150), wherein that partial region (140) of the rear side (132) of the semiconductor chip (110) which is coated with the through-contact filling material (142) is connected to at least one bonding pad (152) on the carrier substrate (150),
   wherein, in the through-plating step, at least one sidewall (136) of the semiconductor chip (110) is coated simultaneously with the through-contact filling material (142).

2. The method according to claim 1, wherein a eutectic bonding method is used in method step d).

3. The method according to claim 1, wherein the through-contact filling material (142) comprises at least one semiconductor material.

4. The method according to claim 1, wherein the bonding pad (152) comprises aluminum.

5. The method according to claim 1, wherein, in the through-plating step, at least one wall (138) of at least one plated-through hole (128) is coated simultaneously with the through-contact filling material (142).

6. The method according to claim 1, wherein, in the through-plating step, at least one frame (156) is produced on the rear side (132), and wherein, after the semiconductor chip (110) has been applied to the carrier substrate (150), an interspace (164) arises within the frame (156).

7. The method according to claim 1, wherein the semiconductor chip (110) comprises at least one of the following elements: an integrated circuit; a sensor structure; and a micromechanical structure (182).

8. The method according to claim 1, wherein, before the through-plating step, at least one insulating material (124, 134) is applied to the semiconductor chip (110).

9. The method according to claim 1, wherein the through-contact filling material (142) comprises germanium.

10. The method according to claim 1, wherein a conformal deposition method is used in the through-plating step.

11. The method according to claim 10, wherein the conformal deposition method is a liquid phase deposition method.

12. The method according to claim 10, wherein the conformal deposition method is a CVD method.

13. The method according to claim 12, wherein the conformal deposition method is also a liquid phase deposition method.

14. The method according to claim 1, wherein, in the through-plating step, at least one closed frame (156) is produced on the rear side (132), and wherein, after the semiconductor chip (110) has been applied to the carrier substrate (150), an interspace (164) arises within the frame (156).

15. A method for producing a semiconductor component (166), comprising the following steps:
   a) producing a semiconductor chip (110) on a starting substrate (112), wherein the semiconductor chip (110) is connected to the starting substrate (112) in at least one supporting location (116), wherein the semiconductor chip (110) has a front side (130) facing away from the starting substrate (112) and a rear side (132) facing the starting substrate (112),
   b) in at least one through-plating step, applying at least one through-contact filling material (142) to the semiconductor chip (110), wherein at least one partial region (140) of the rear side (132) is coated with the through-contact filling material (142),
   c) separating the semiconductor chip (110) from the starting substrate (112), and
   d) applying the semiconductor chip (110) to at least one carrier substrate (150), wherein that partial region (140) of the rear side (132) of the semiconductor chip (110) which is coated with the through-contact filling material (142) is connected to at least one bonding pad (152) on the carrier substrate (150),
   wherein, in the through-plating step, at least one frame (156) is produced on the rear side (132), and wherein, after the semiconductor chip (110) has been applied to the carrier substrate (150), a hermetically sealed interspace (164) arises within the frame (156).

* * * * *